United States Patent
Aita et al.

(10) Patent No.: US 7,957,151 B2
(45) Date of Patent: Jun. 7, 2011

(54) CIRCUIT COMPONENT, ELECTRODE CONNECTION STRUCTURE AND DISPLAY DEVICE INCLUDING THE SAME

(75) Inventors: Tetsuya Aita, Sakai (JP); Yoshimasa Chikama, Kizugawa (JP)

(73) Assignee: Sharp Kabushiki Kaisha, Osaka (JP)

( * ) Notice: Subject to any disclaimer, the term of this patent is extended or adjusted under 35 U.S.C. 154(b) by 625 days.

(21) Appl. No.: 12/063,152

(22) PCT Filed: Oct. 30, 2006

(86) PCT No.: PCT/JP2006/321669
§ 371 (c)(1),
(2), (4) Date: Feb. 7, 2008

(87) PCT Pub. No.: WO2007/063667
PCT Pub. Date: Jun. 7, 2007

(65) Prior Publication Data
US 2009/0141438 A1 Jun. 4, 2009

(30) Foreign Application Priority Data

Dec. 1, 2005 (JP) ................................. 2005-348124

(51) Int. Cl.
*H05K 1/00* (2006.01)

(52) U.S. Cl. ......... 361/749; 361/757; 361/736; 174/254
(58) Field of Classification Search .................. 361/749, 361/757, 736; 257/E33.075
See application file for complete search history.

(56) References Cited

U.S. PATENT DOCUMENTS

| | | | | | |
|---|---|---|---|---|---|
| 5,214,346 | A | * | 5/1993 | Komatsu | 313/309 |
| 5,474,834 | A | * | 12/1995 | Tanahashi et al. | 428/209 |
| 6,114,864 | A | * | 9/2000 | Soejima et al. | 324/754 |
| 6,166,333 | A | * | 12/2000 | Crumly et al. | 174/255 |
| 2001/0040794 | A1 | * | 11/2001 | Shimizu et al. | 361/749 |
| 2005/0017373 | A1 | * | 1/2005 | Nishikawa et al. | 257/778 |
| 2005/0236623 | A1 | | 10/2005 | Takechi et al. | |
| 2007/0176182 | A1 | * | 8/2007 | Wen et al. | 257/79 |

FOREIGN PATENT DOCUMENTS

| | | |
|---|---|---|
| CN | 1381888 A | 11/2002 |
| JP | 9-199206 A | 7/1997 |
| JP | 11-305259 A | 11/1999 |
| JP | 2001-290136 A | 10/2001 |
| JP | 2001-337340 A | 12/2001 |
| JP | 2004-296917 A | 10/2004 |
| JP | 2005-311205 A | 11/2005 |

OTHER PUBLICATIONS

Official communication issued in the International Application No. PCT/JP2006/321669, mailed on Jan. 23, 2007.

* cited by examiner

*Primary Examiner* — Tuan T Dinh
*Assistant Examiner* — Steven Sawyer
(74) *Attorney, Agent, or Firm* — Keating & Bennett, LLP

(57) ABSTRACT

An electrode connection structure including a first circuit component including a resin plate, a barrier film stacked on a surface of the resin plate, a circuit section formed on the barrier film and a first electrode provided on the surface of the resin plate on which the barrier film is stacked, and a second circuit component arranged to face the first circuit component and having a second electrode facing the first electrode, wherein the first and second electrodes are electrically connected via pressure applied thereto in the directions approaching each other and a portion of the barrier film surrounding the first electrode is at least partially removed from the surface of the resin plate.

11 Claims, 13 Drawing Sheets

CIRCUIT COMPONENT, ELECTRODE CONNECTION STRUCTURE AND DISPLAY DEVICE INCLUDING THE SAME

BACKGROUND OF THE INVENTION

1. Field of the Invention

The present invention relates to a circuit component including a flexible plate on which a barrier film and electrodes are formed, an electrode connection structure for connection between the electrodes and a display device including the electrode connection structure.

2. Description of the Related Art

For display devices such as liquid crystal displays, organic EL displays and electrophoretic displays, an active matrix substrate has widely been used as a first circuit component prepared by forming a plurality of thin film transistors (hereinafter referred to as TFTs) on a glass plate.

The TFTs are arranged in a matrix pattern. The active matrix substrate also carries thereon a plurality of source lines and gate lines arranged in a lattice pattern and connected to the TFTs. The source lines are arranged parallel to each other and the gate lines are arranged to be orthogonal to the source lines. The source and gate lines are extended such that their ends reach a frame region on the periphery of the substrate and terminals are formed at the ends (the terminals may be referred to as electrodes in the description).

A second circuit component such as an IC driver is implemented on the frame region. The IC driver includes a plurality of electrodes corresponding to the terminals. The electrodes of the IC driver are electrically connected to the terminals of the lines, respectively.

Press bonding using an anisotropic conductive film (ACF) is known as a method for electrically connecting the terminals of the first circuit component and the electrodes of the second circuit component. The ACF is an insulating adhesive material (binder) containing conductive particles dispersed therein. For example, it is prepared by dispersing conductive particles in an insulating thermosetting epoxy adhesive. The conductive particles may be particles made of nickel-gold plated cross linked polystyrene cores (see, for example, Japanese Unexamined Patent Publication No. 9-199206).

In recent years, the above-listed displays are demanded to be portable and flexible. With this trend, research has been conducted to use a lightweight and flexible plastic plate as the active matrix substrate in place of the glass plate.

In general, the plastic plate is much more likely to absorb moisture than the glass plate. Therefore, the plate is apt to shrink or warp. For this reason, a barrier film such as an impervious inorganic film is stacked on the surface of the plastic plate. That is, if the plastic plate is used for the active matrix substrate (first circuit component), the lines and terminals are formed on the barrier film stacked on the plastic plate.

If the IC driver (second circuit component) is implemented on the active matrix substrate (first circuit component) using the plastic plate by press bonding, pressure is concentrated on the terminals on the relatively soft plastic plate. Therefore, a crack is likely to occur in the barrier film below the terminals. This phenomenon occurs significantly when the ACF containing the conductive particles is used.

Referring to FIG. 27 and FIG. 28, a conventional electrode connection structure will be explained. FIG. 27 is an enlarged sectional view illustrating the connection structure and FIG. 28 is a plan view illustrating an enlargement of a cracked part of the first circuit component.

A TFT substrate 101 as the first circuit component includes a plastic plate 102, a barrier film 103 stacked on the plastic plate 102, such as an inorganic film, and a plurality of terminals 104 as first electrodes formed on the surface of the barrier film 103. The terminals 104 are arranged at predetermined intervals and adjacent to each other. Though not shown, a circuit section including lines and electrodes is also formed on the barrier film 103 of the TFT substrate 101.

An IC driver 105 as the second circuit component includes A plurality of bumps 106 as second electrodes. An anisotropic conductive film 107 is provided between the IC driver 105 and the TFT substrate 101 to surround the bumps 106 and the terminals 104. As the IC driver 105 is implemented on the TFT substrate 101 by press bonding, the bumps 106 are electrically connected to the terminals 104.

When the terminal 104 is damaged and a crack 110 is generated in a portion of the barrier film 103 below the damaged terminal, the crack 110 grows and expands in the barrier film 103. As a result, the other terminals 104b adjacent to the first damaged terminal 104a and the circuit section such as lines (not shown) are damaged or broken by the crack 110 propagated in the barrier film 103. In such a case, display quality of the display device including the TFT substrate 101 is decreased.

According to a known technique for solving such a problem, a breaking stress of the plating on the conductive particles is set relatively low (e.g., 73 MPa or lower) and the press bonding stress is set higher than the breaking stress of the plating (See, for example, Japanese Unexamined Patent Publication No. 2001-337340). The technique is intended to keep the electrical connection excellent by reducing the damage to the terminals.

If the material of the terminals and the size and material of the conductive particles are varied, the technique of Japanese Unexamined Patent Publication No. 2001-337340 may not work enough to reduce the damage to the terminals of the first circuit component caused in the press bonding of the second circuit component and the electrical connection may not be maintained in good condition.

The problem also arises in the cases where the ACF is not provided (i.e., the terminals are directly press bonded), where the ACF is replaced with conductive paste, an NCF (non conductive film) or an adhesive resin, and where common transfer electrodes are interposed between the electrodes.

Further, due to low adhesion of the barrier film to the plastic plate, there is also a problem of low adhesion of the second circuit component to the plastic plate of the first circuit component.

SUMMARY OF THE INVENTION

In order to overcome the problems described above, preferred embodiments of the present invention reduce the damage to the electrodes by reducing the propagation of the crack in the barrier film and improve the adhesion between the circuit components.

According to a preferred embodiment of the present invention, a portion of the barrier film surrounding the first electrodes is at least partially removed from the surface of the flexible plate. The flexible plate may be a plate made of polymeric material such as a resin or plastic.

To be more specific, a circuit component according to a preferred embodiment of the present invention preferably includes a flexible plate, a barrier film stacked on a surface of the flexible plate, a circuit section formed on the barrier film and a first electrode provided on the surface of the flexible plate on which the barrier film is stacked, wherein a portion of the barrier film surrounding the first electrode is at least partially removed from the surface of the flexible plate.

An electrode connection structure according to a preferred embodiment of the present invention includes: a first circuit component including a flexible plate, a barrier film stacked on a surface of the flexible plate, a circuit section formed on the barrier film and a first electrode provided on the surface of the flexible plate on which the barrier film is stacked; and a second circuit component arranged to face the first circuit component and having a second electrode facing the first electrode, wherein the first electrode of the first circuit component and the second electrode of the second circuit component are connected via pressure applied thereto in the directions approaching each other and a portion of the barrier film surrounding the first electrode is at least partially removed from the surface of the flexible plate.

The second circuit component may include a body having a circuit connected to the second electrode and a portion of the body and the first circuit component may be in contact with each other via pressure applied thereto in the directions approaching each other. A portion of the barrier film surrounding a portion of the first circuit component in contact with the body may be at least partially removed from the surface of the flexible plate.

The first electrode is preferably provided on the flexible plate with the barrier film interposed therebetween.

The first electrode may be provided directly on the surface of the flexible plate.

It is preferable that an anisotropic conductive film containing conductive particles is interposed between the first and second electrodes.

A plurality of first electrodes may be located to be adjacent to each other.

A common transfer electrode may be interposed between the first and second electrodes.

It is preferable that the first electrode includes a plurality of input terminals for inputting a signal to the second circuit component and a plurality of output terminals arranged at a certain interval from the input terminals for outputting a signal from the second circuit component and a portion of the barrier film between the input terminals and the output terminals is also removed.

A removed region from which the barrier film is removed may be configured such that at least a portion of its boundary line that defines the removed region is curved when viewed in a direction that is normal to the surface of the flexible plate.

It is preferable that a plurality of first electrodes are provided at certain intervals and removal regions from which the barrier film is removed are formed between adjacent first electrodes and each of the removed regions has a width not larger than a clearance between adjacent first electrodes.

A plurality of first electrodes may be formed at certain intervals and removed regions from which the barrier film is removed may be formed between adjacent first electrodes. Each of the removed regions may be configured of a plurality of slits.

A plurality of first electrodes may be formed at certain intervals and removed regions from which the barrier film is removed may be formed between adjacent first electrodes. Each of the removed regions may be arranged to have a serpentine shaped configuration snaking between adjacent first electrodes.

An electrode connection structure according to another preferred embodiment of the present invention includes: a first circuit component including a flexible plate, a barrier film stacked on a surface of the flexible plate, a circuit section formed on the barrier film and a first electrode provided on the surface of the flexible plate on which the barrier film is stacked; and a second circuit component arranged to face the first circuit component and having a second electrode facing the first electrode, wherein the first electrode of the first circuit component and the second electrode of the second circuit component are connected via pressure applied thereto in the directions approaching each other and a portion of the barrier film surrounding the first electrode is at least partially thinner than the other portion.

A display device according to a further preferred embodiment of the present invention includes: a first circuit component including a flexible plate, a barrier film stacked on a surface of the flexible plate, a circuit section formed on the barrier film and a first electrode provided on the surface of the flexible plate on which the barrier film is stacked; a second circuit component arranged to face the first circuit component and having a second electrode facing the first electrode; an electrode connection structure in which the first electrode of the first circuit component and the second electrode of the second circuit component are electrically connected via pressure applied thereto in the directions approaching each other; and a display device including a display region controlled by the circuit section of the first circuit component, wherein a portion of the barrier film surrounding the first electrode is at least partially removed from the surface of the flexible plate.

The effects and advantages of various preferred embodiments of the present invention will be explained below.

If the first circuit component (circuit component) includes the flexible plate and when the second electrode is electrically connected to the first electrode via pressure applied to them in the directions approaching each other, the pressure may possibly cause a crack in a portion of the barrier film near the first electrode. In this aspect, according to various preferred embodiments of the present invention, a portion of the barrier film surrounding the first electrode is at least partially removed from the surface of the flexible plate. Therefore, even if the crack occurs, the crack does not propagate outward beyond the region from which the barrier film is removed. As a result, damage to the circuit section by the crack is less likely to occur. In addition, the adhesion between the flexible plate of the first component and the second component is improved in the region from which the barrier film is removed.

The body of the second circuit component may be in contact with the first circuit component via pressure applied to them in the directions approaching each other. In this case, if the barrier film is provided in a portion of the first circuit component in contact with the body, a crack may possibly occur in a portion of the barrier film near the contacting portion. According to various preferred embodiments of the present invention, a portion of the barrier film surrounding the portion of the first circuit component in contact with the body is at least partially removed from the surface of the flexible plate. Therefore, even if the crack occurs, the crack is prevented from propagating outward beyond the region from which the barrier film is removed.

If the barrier film is interposed between the electrode and the flexible plate, the crack, if it occurs in a portion of the barrier film, does not extend to the other portion of the barrier film as described above. If the first electrode is directly provided on the surface of the flexible plate, the crack does not occur because the barrier film itself does not exist. Therefore, the damage to the circuit section due to the crack is prevented.

If an anisotropic conductive film is provided between the first and second electrodes, the first electrode is electrically connected to the second electrode via conductive particles in the anisotropic conductive film. In this case, stress is concentrated on a portion of the first electrode in contact with the conductive particles and the crack is likely to occur in a portion of the barrier film near the stressed portion. According to various preferred embodiments of the present invention, a portion of the barrier film surrounding the first electrode is at least partially removed. Therefore, the propagation of the crack is restrained. That is, preferred embodiments of the present invention is particularly effective when the anisotropic conductive film is interposed between the first and second electrodes.

Even in the case where the first circuit component includes a plurality of first electrodes arranged to be adjacent to each other, a portion of the barrier film surrounding each of the first electrodes is at least partially removed. Therefore, if the crack occurs in a portion of the barrier film near one of the first electrodes, damage to the other first electrodes due to the crack is restrained.

If a common transfer electrode is interposed between the first and second electrodes, pressure is applied to the first electrode from the second electrode via the common transfer electrode. As a result, the crack may occur in a portion of the barrier film near the first electrode as described above. However, since the portion of the barrier film surrounding the first electrode is at least partially removed, the damage to the circuit section by the propagation of the crack is restrained.

If a portion of the barrier film corresponding to the region between the input terminals and the output terminals as the first electrodes is removed, the propagation of the crack between the input and output terminals is prevented. If the removed region from which the barrier film is removed is configured such that its boundary line is curved, the sharp edges of the removed region are reduced and the crack is less likely to occur. Further, if the width of the removed region is defined to be not larger than a clearance between adjacent first electrodes, the propagation of the crack is prevented and, at the same time, the barrier effect of the barrier film is maintained.

If the removed region is configured of a plurality of slits or formed in a serpentine shape, the surface area of the barrier film is not reduced very much. Therefore, the barrier effect of the barrier film is maintained even if the barrier film is removed. Further, if a portion of the barrier film surrounding the first electrode is formed thinner than the other portion, the barrier effect of the barrier film is maintained and the resistance to the crack is improved. As a result, the propagation of the crack is less likely to occur.

According to preferred embodiments of the present invention, a portion of the barrier film surrounding the first electrode is at least partially removed from the surface of the flexible plate. Therefore, even if a crack occurs in a portion of the barrier film adjacent to the first electrode, the crack is prevented from growing outward beyond the region from which the barrier film is removed. As a result, damage to the circuit section and the like due to the crack is restrained. In addition, the adhesion between the flexible plate of the first circuit component and the second circuit component is improved in the region from which the barrier film is removed.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, preferred embodiments of the present invention will be described in detail with reference to the drawings. The preferred embodiments are not intended to limit the present invention.

First Preferred Embodiment

Figure 1:
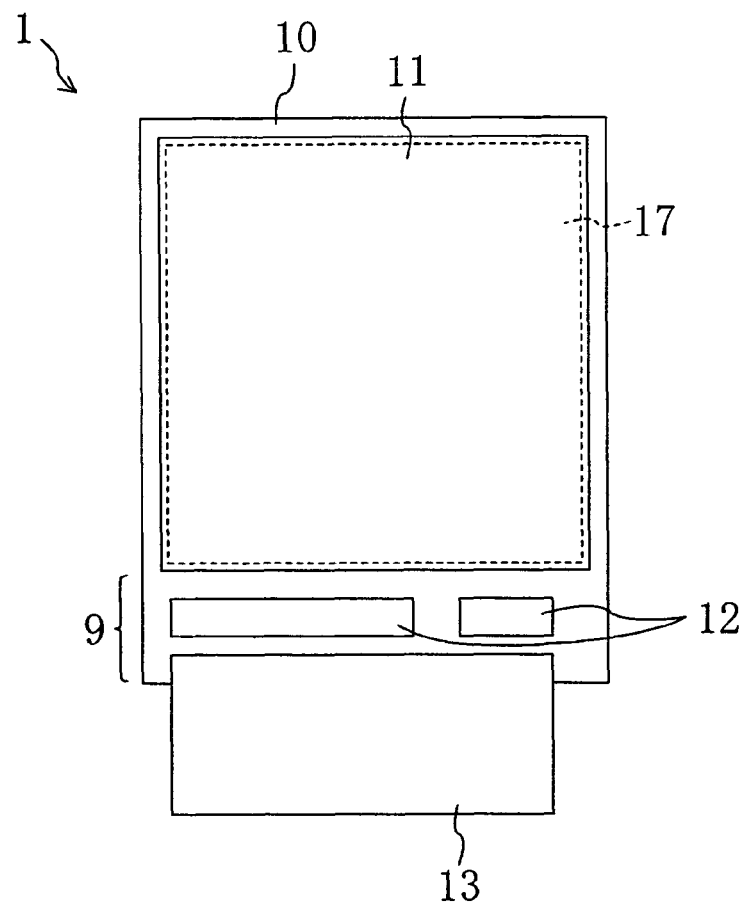
FIG. 1 is a plan view illustrating the appearance of a liquid crystal display device of a first preferred embodiment of the present invention.
Figure 2:
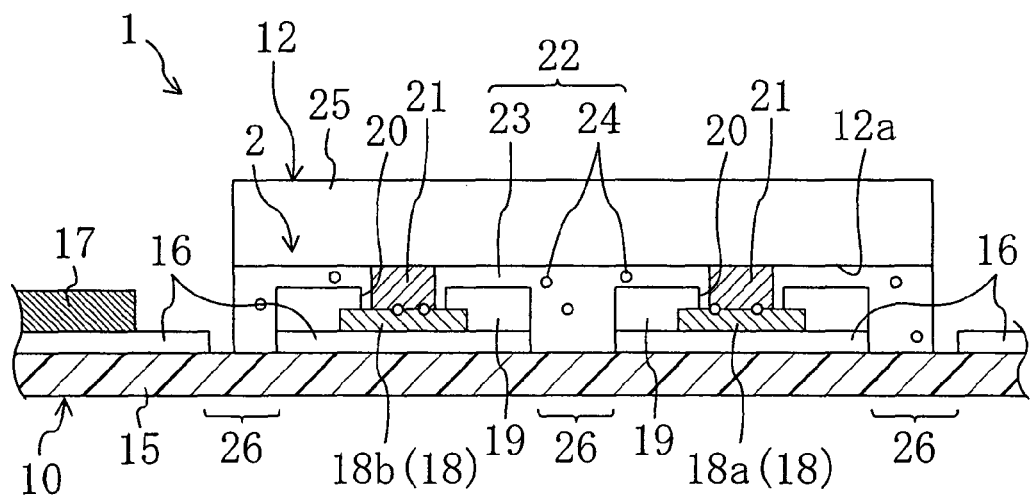
FIG. 2 is a sectional view illustrating an enlargement of an electrode connection structure of the first preferred embodiment of the present invention.
Figure 3:
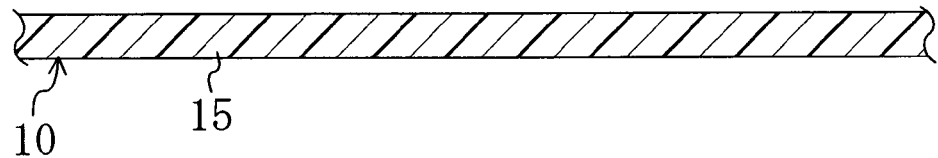
FIG. 3 is a sectional view illustrating a plastic plate.

FIG. 1 to FIG. 8 show a first preferred embodiment of the present invention. FIG. 1 is a plan view illustrating the appearance of a liquid crystal display device 1 as a display device. FIG. 2 is a sectional view illustrating enlargement of an electrode connection structure 2. FIG. 3 to FIG. 8 are sectional views illustrating the steps of producing the electrode connection structure 2.

As shown in FIG. 1, the liquid crystal display device 1 includes a TFT substrate 10 as a first circuit component, a counter substrate 11 arranged to face the TFT substrate 10 and a liquid crystal layer (not shown) provided between the TFT substrate 10 and the counter substrate 11. An IC driver 12 as a second circuit component and an FPC (flexible printed circuit) 13 are implemented on the TFT substrate 10. The FPC 13 functions to supply signals to the IC driver 12 and the IC driver 12 functions to control and drive TFTs.

Though not shown, the TFT substrate 10 includes a plurality of TFTs arranged in a matrix pattern, a plurality of gate lines and source lines arranged orthogonal to each other and connected to the TFTs and pixel electrodes provided in one-to-one relationship with the TFTs for driving the liquid crystal layer. The counter substrate 11 includes a common electrode made of, for example, ITO (Indium Tin Oxide), and a color filter.

As shown in FIG. 1, the TFT substrate 10 is larger than the counter substrate 11. A peripheral region of the TFT substrate 10 not overlapping with the counter substrate 11 serves as an implementation region 9 on which the IC driver 12 and the FPC 13 are implemented. A region where the TFT substrate 10 and the counter substrate 11 overlap with each other serves as a display region 8 as a display section. One of the unique features of the present preferred embodiment of the present invention is the connection structure between the TFT substrate 11 and the IC driver 12. Further explanation will be provided with reference to FIG. 2.

The TFT substrate 10 includes a plastic plate 15 as a flexible plate, a barrier film 16 stacked on the surface of the plastic plate 15 and a circuit section 17 formed on the barrier film 16. The circuit section 17 includes, for example, the gate lines, source lines, TFTs and pixel electrodes described above. In FIG. 2, the circuit section 17 is simplified and schematically illustrated. As the flexible plate, a plate based on polymeric material such as resin or plastic may be used.

The plastic plate 15 preferably is a resin plate. The barrier film 16 may be made of an inorganic film and prevents permeation of at least one of moisture and impurities such as ions and gases. In general, the plastic plate 15 is highly water absorptive. Therefore, the surface of the plastic plate 15 is covered with the barrier film 16 to reduce the water absorbing property. FIG. 2 shows an example in which the barrier film 16 is stacked on one of the surfaces of the plastic plate 15. The barrier film 16 may be stacked on both of the surfaces of the plastic plate 15.

A plurality of terminals 18 as first electrodes are formed on the implementation region 9 of the plastic plate 15 to be adjacent to each other. The terminals 18 are provided on the surface of the plastic plate 15 on which the barrier film 16 is stacked (i.e., on the surface on which the barrier film 16 is stacked and the IC driver 12 is implemented).

Figure 9:
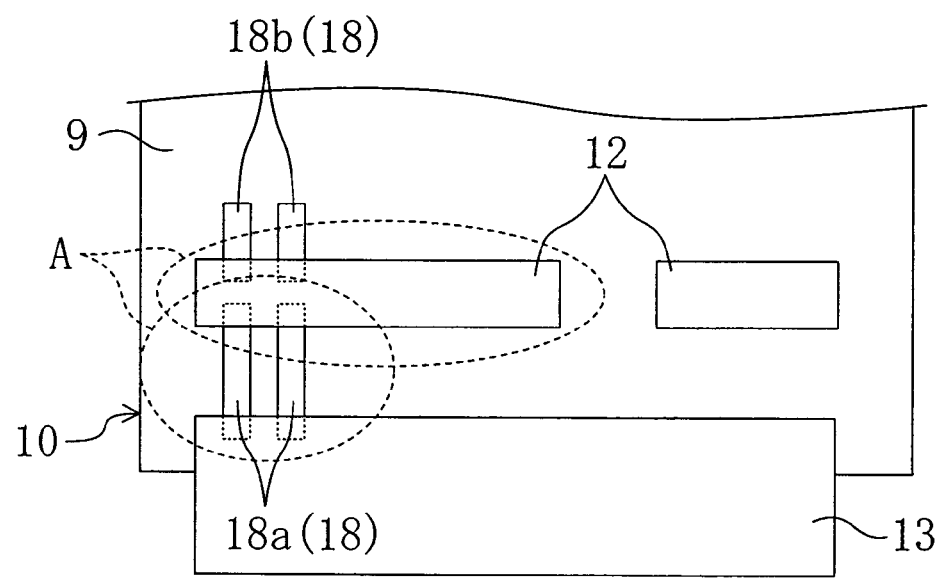
FIG. 9 is an enlarged plan view illustrating an implementation region shown in FIG. 1.
Figure 10:
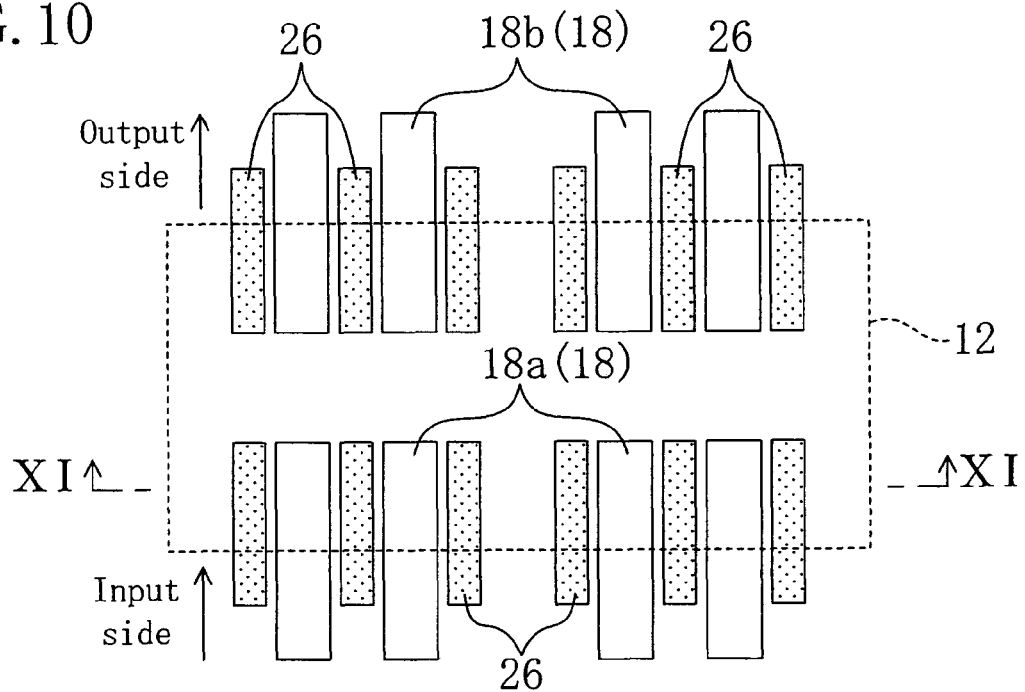
FIG. 10 is a plan view illustrating partial enlargement of FIG. 9.
Figure 11:
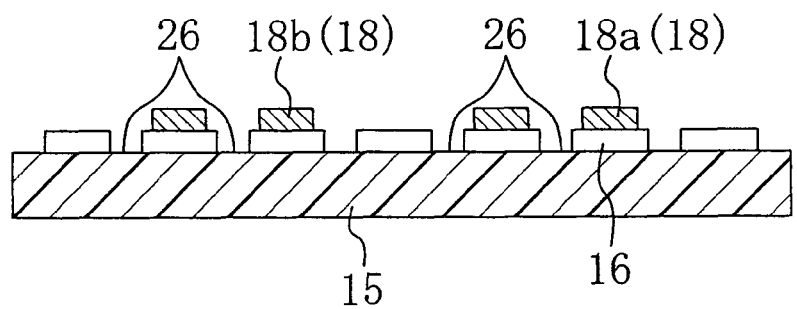
FIG. 11 is a sectional view taken along the line XI-XI shown in FIG. 10.

FIG. 9 is a plan view illustrating enlargement of the implementation region 9 shown in FIG. 1, FIG. 10 is a plan view illustrating partial enlargement of FIG. 9 and FIG. 11 is a sectional view taken along the line XI-XI shown in FIG. 10. FIG. 9 shows only some of the terminals 18 and the other terminals 18 are omitted.

As shown in FIG. 10, the terminals 18 include a plurality of input terminals 18a for inputting signals to the IC driver 12 and a plurality of output terminals 18b arranged at a certain interval from the input terminals 18a for outputting signals from the IC driver 12.

The input terminals 18a preferably have a substantially rectangular shape extending in the longitudinal direction in FIG. 10 (the direction from the edge to the middle of the plate 15), respectively, and arranged at certain intervals in the lateral direction in FIG. 10. The output terminals 18b are arranged in the same manner as the input terminals 18a above the input terminals 18a in the longitudinal direction in FIG. 10. The output terminals 18b are arranged longitudinally above the input terminals 18a in one-to-one relationship with the input terminals 18a.

Among the terminals 18, the output terminals 18b are arranged, for example, at the ends of the gate lines drawn from the circuit section 17 to the implementation region 9. That is, the terminals 18 are connected to the circuit section 17. The input terminals 18a are connected to output terminals of the FPC 13 (not shown).

The terminals 18 according to the present preferred embodiment are formed on the plastic plate 15 with the barrier film 16 interposed therebetween. The terminals 18 are covered with an insulating film 19, such as a gate insulating film, and through holes 20 are formed in the insulating film 19 to come above the terminals 18. Accordingly, the terminals 18 are exposed in the through holes 20 of the insulating film 19.

As shown in FIG. 2, the IC driver 12 includes a body 25 having a circuit (not shown) and bumps 21 as second electrodes connected to the circuit of the body 25. The bumps 21 are formed on an implementation surface 12a, i.e., the bottom surface, of the body 25 and arranged to be adjacent to each other. The bumps 21 correspond to the terminals 18, respectively. To be more specific, when the IC driver 12 is arranged to face the implementation region 9 of the TFT substrate 10, the bumps 21 face the terminals 18, respectively, with the through holes 20 interposed therebetween.

The IC driver 12 is implemented on the TFT substrate 10 with an anisotropic conductive film (hereinafter abbreviated as ACF) 22 interposed therebetween. The ACF 22 includes a binder 23 which is insulating adhesive material and a plurality of conductive particles 24 dispersed therein. The terminals 18 of the TFT substrate 10 and the bumps 21 of the IC driver 12 are electrically connected to each other by thermocompression bonding via pressure applied thereto in directions approaching each other.

The conductive particles 24 of the ACF 22 are interposed between the terminals 18 and the bumps 21 in a compressed state. To be more specific, the terminals 18 and the bumps 21 are electrically connected via the conductive particles 24. Further, the terminals 18 and the bumps 21 are brought into conduction as they are partially in direct contact.

A portion of the barrier film 16 surrounding the terminals 18 is at least partially removed from the surface of the plastic plate 15.

According to the first preferred embodiment, a portion of the barrier film 16 in an area A enclosed with a broken line shown in FIG. 9 is removed (an area surrounding the input and output sections of the IC driver 12 and the FPC 13). As shown in FIG. 10, portions of the barrier film 16 between the input terminals 18a and between the output terminals 18b are removed. Accordingly, substantially rectangular removed regions 26 from which the barrier film 16 is removed are provided and the surface of the plate 15 is exposed in the removed regions 26 as shown in FIG. 11. A portion of the barrier film 16 corresponding to the middle portion of the IC driver 12 is not removed and left unchanged.

The terminals 18 may be formed on strips of the barrier film 16 formed on the plastic plate 15. In other words, each of the removed regions 26 in which the barrier film 16 is removed from the surface of the plastic plate 15 may be arranged to surround each of the terminals 18.

Production Method

Figure 4:
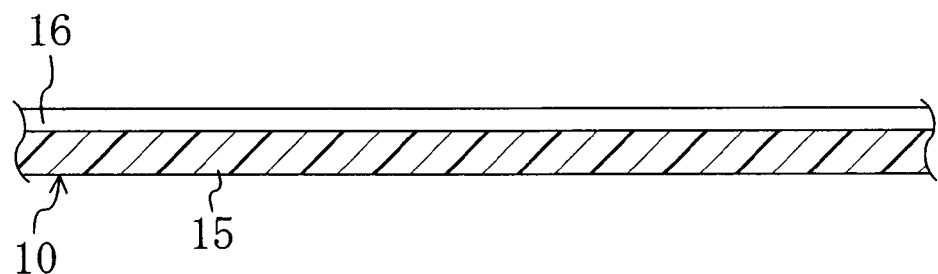
FIG. 4 is a sectional view illustrating the plastic plate with a barrier film stacked thereon.

A method for producing the electrode connection structure 2 will be explained with reference to FIG. 2 to FIG. 8. First, as shown in FIG. 4, a barrier film 16 made of an inorganic film of $SiO_2$ or SiNx is deposited in a thickness of about 0.1 μm on a surface of a plastic plate 15 shown in FIG. 3 by a thin film deposition technique such as sputtering or CVD.

Figure 5:
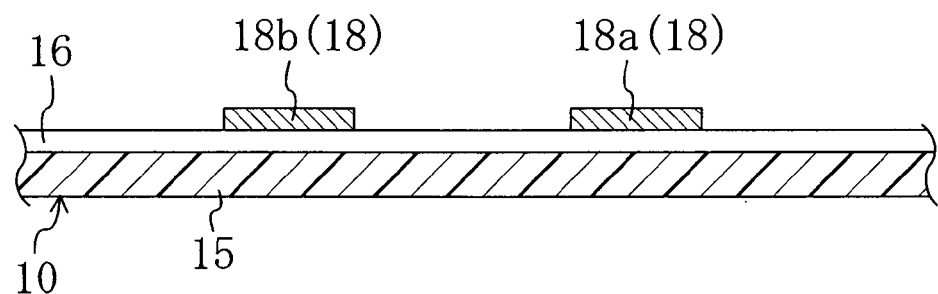
FIG. 5 is a sectional view illustrating terminals formed on the barrier film.

Then, in a first electrode production process shown in FIG. 5, a plurality of terminals 18 are formed on the surface of the barrier film 16 as first electrodes by photolithography or the like. The terminals 18 are arranged in correspondence with the arrangement of bumps 21 of an IC driver 12. The terminals 18 are made of a monolayer or a multilayer of Al, Ti, Mo and ITO. The terminals 18 are preferably about 0.1 μm to about 0.5 μm in thickness. The first electrode production process is carried out simultaneously with the process of forming gate lines or source lines connected to TFTs.

Figure 6:
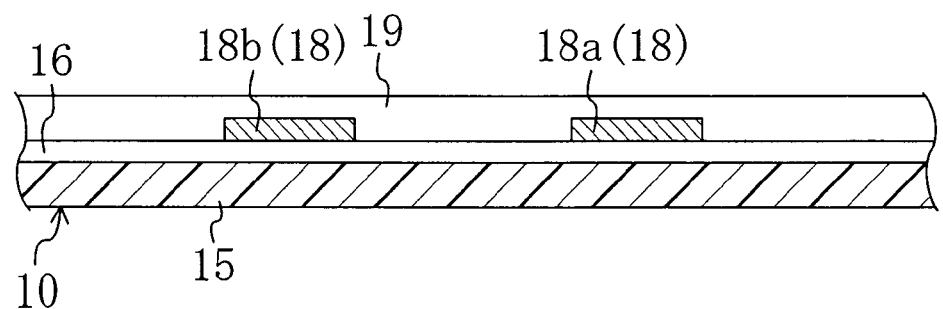
FIG. 6 is a sectional view illustrating an insulating film covering the terminals.
Figure 7:
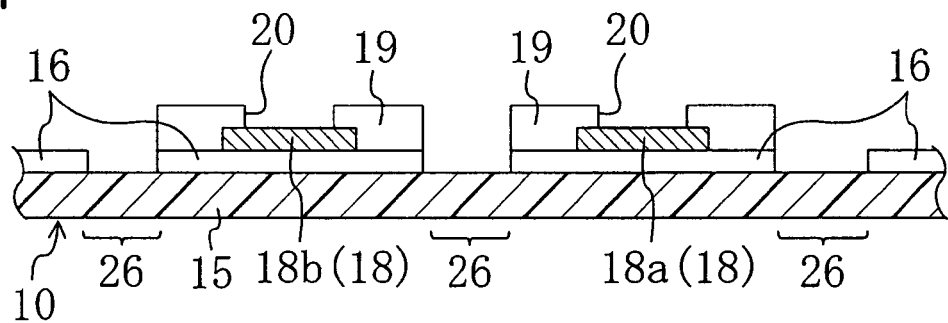
FIG. 7 is a sectional view illustrating the barrier film and the insulating film after patterning.

Then, in an insulation film production process, an insulating film 19 made of $SiO_2$ or SiNx is formed to have a thickness of about 0.1 μm to about 0.5 μm. The insulating film production process is simultaneously carried out with the process of forming a gate insulating film for the TFTs. The insulating film 19 is uniformly formed on the barrier film 16 to cover the terminals 18 as shown in FIG. 6. Then, portions of the insulating film 19 around the terminals 18 are removed by photolithography and through holes 20 are formed in the insulating film 19 such that each of them comes above the terminals 18 as shown in FIG. 7.

In a barrier film removal process, portions of the barrier film 16 surrounding the terminals 18 are partially removed. The barrier film removal process is simultaneously carried out with the insulating film production process. As shown in FIG. 7, portions of the insulating film 19 and portions of the barrier film 16 surrounding the terminals 18 are removed at the same time by photolithography.

According to the present preferred embodiment, a portion of the barrier film 16 in the area A enclosed with a broken line shown in FIG. 9 is partially removed. To be more specific, potions of the barrier film 16 between the input terminals 18a and between the output terminals 18b are removed. That is, substantially rectangular removed regions 26 from which the barrier film 16 is removed are provided. As shown in FIG. 11, the surface of the plate 15 is exposed in the removed regions 26 from which the barrier film 16 is removed. A portion of the barrier film 16 corresponding to the middle portion of the IC driver 12 is not removed and left unchanged.

In this process, the barrier film 16 on the resin plate is partially removed. Since the removed regions 26 from which the barrier film 16 is removed are provided on a peripheral region of the plastic plate 15, the display region 8 provided in the middle of the plate is not adversely affected. Further, since the area of the removed regions 26 is relatively small as compared with the entire area of the barrier film 16, the removal of the barrier film 16 does not impair the effect of the barrier film 16 of preventing moisture permeation into the plastic plate 15. The portions of the barrier film 16 surrounding the terminals 18 are at least partially removed from the surface of the plastic plate 15. However, from the aspect of restraining the propagation of the crack more significantly, it is preferable that the portions of the barrier film 16 surrounding the terminals 18 are almost entirely removed.

Figure 8:
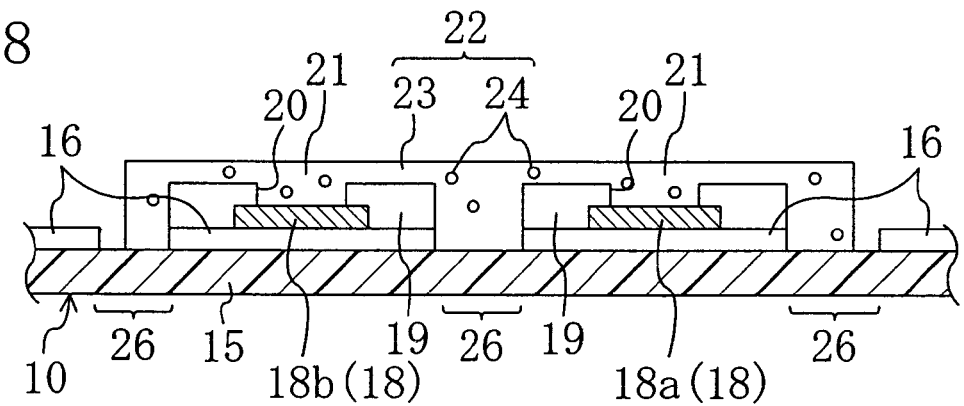
FIG. 8 is a sectional view illustrating an ACF covering the terminals.

Then, in an ACF bonding process shown in FIG. 8, an ACF 22 is temporarily bonded to the plastic plate 15 to cover the terminals 18 and the insulating film 19. The ACF 22 may be an epoxy-based adhesive in which conductive particles are dispersed. Then, an implementation process is carried out as shown in FIG. 2. In this process, the terminals 18 and the bumps 21 arranged in alignment are subjected to thermocompression bonding to implement the IC driver 12 as the second circuit component onto the TFT substrate 10. As a result, the bumps 21 of the IC driver 12 are electrically connected to the terminals 18 in the through holes 20 via the conductive particles 24. The electrode connection structure 2 is produced by the above-described processes. A general thermocompression bonding tool may be used to implement the IC driver 12. In particular, a tool that allows thermocompression bonding at a relatively low temperature is preferably used. The thermocompression bonding of the IC driver 12 is carried out at suitable pressure and temperature of about 10 MPa to about 50 MPa and about 180° C.

According to the first preferred embodiment, portions of the barrier film 16 surrounding the terminals 18 are removed from the surface of the plastic plate 15. Therefore, even if a crack occurs in a portion of the barrier film 16 below a certain terminal 18, the crack does not propagate outward beyond the regions from which the barrier film is removed (removed regions 26). As a result, damage to the adjacent terminals 18 and the circuit section 17 due to the crack is restrained and the rate of defective products is reduced.

The barrier film 16 is able to prevent moisture permeation into the plastic plate 15 on the one hand, but it is likely to reduce the adhesion to the plastic plate 15 on the other hand. According to the present preferred embodiment, the barrier film does not exist in the removed regions 26. Therefore, the plastic plate 15 and the IC driver 12 are directly bonded to each other in the removed regions via an adhesive layer 23 of the ACF 22 and the adhesion between them is improved.

According to the present preferred embodiment, the propagation of the crack in the barrier film 16 is restrained. As a result, damage to the circuit section 17 and the adjacent terminals 18 is reduced and the adhesion between the plastic plate 15 and the IC driver 12 is improved.

When the ACF 22 is interposed between the terminals 18 and the bumps 21, the crack is likely to occur in a portion of the barrier film 16 below the terminals 18 in contact with the conductive particles 24 as stress is particularly concentrated thereon. According to the present preferred embodiment, the crack, if it occurs, is effectively restrained from propagating.

Second Preferred Embodiment

Figure 12:
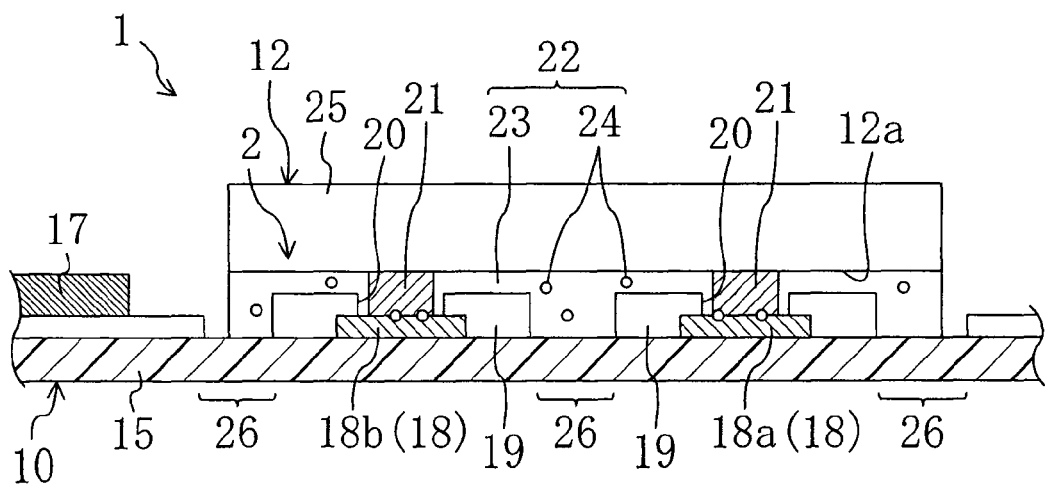
FIG. 12 is a sectional view illustrating enlargement of an electrode connection structure of a second preferred embodiment of the present invention.

FIG. 12 shows a second preferred embodiment of the present invention. In the following preferred embodiments, the same reference numerals are given to the same components as those shown in FIG. 1 to FIG. 8 to omit detailed explanation.

Different from the first preferred embodiment in which the strip-like portions of the barrier film 16 are left between the terminals 18 and the bumps 21, the barrier film 16 is not interposed between the terminals 18 and the bumps 21 in the present preferred embodiment.

The barrier film 16 is removed from not only the removed regions 26 but also regions below the terminals 18 and the insulating film 19. That is, the terminals 18 are formed directly on the surface of the plastic plate 15 of the TFT substrate 10.

For the production of the electrode connection structure of the present preferred embodiment, the barrier film 16 is uniformly formed on the plastic plate 15 as shown in FIG. 4, and then a portion of the barrier film 16 in an area for forming the terminals 18 is removed from the surface of the plastic plate 15 by photolithography to provide a removed region 30.

Then, the terminals 18 are provided in the removed region 30 by patterning. After that, the insulating film production process, the ACF bonding process and the implementation process are carried out in the same manner described in the first preferred embodiment. Thus, the electrode connection structure 2 is produced.

According to the present preferred embodiment, the barrier film 16 is not provided below the terminals 18. Therefore, the crack is not generated even if pressure is applied to the terminals 18. This makes it possible to prevent damage to the adjacent terminals 18 caused by the crack. However, from the aspect of reduction of the water absorption property of the plastic plate 15, the configuration of the first preferred embodiment is more preferable because the barrier film 16 covers a larger area of the surface of the plastic plate 15.

Third Preferred Embodiment

Figure 13:
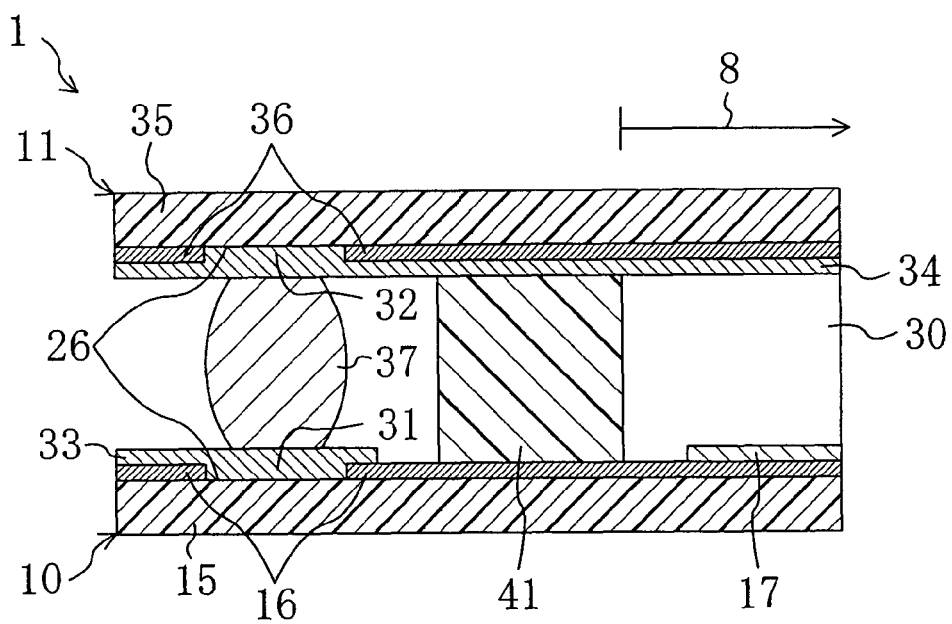
FIG. 13 is a schematic sectional view illustrating enlargement of an electrode connection structure of a third preferred embodiment of the present invention.
Figure 14:
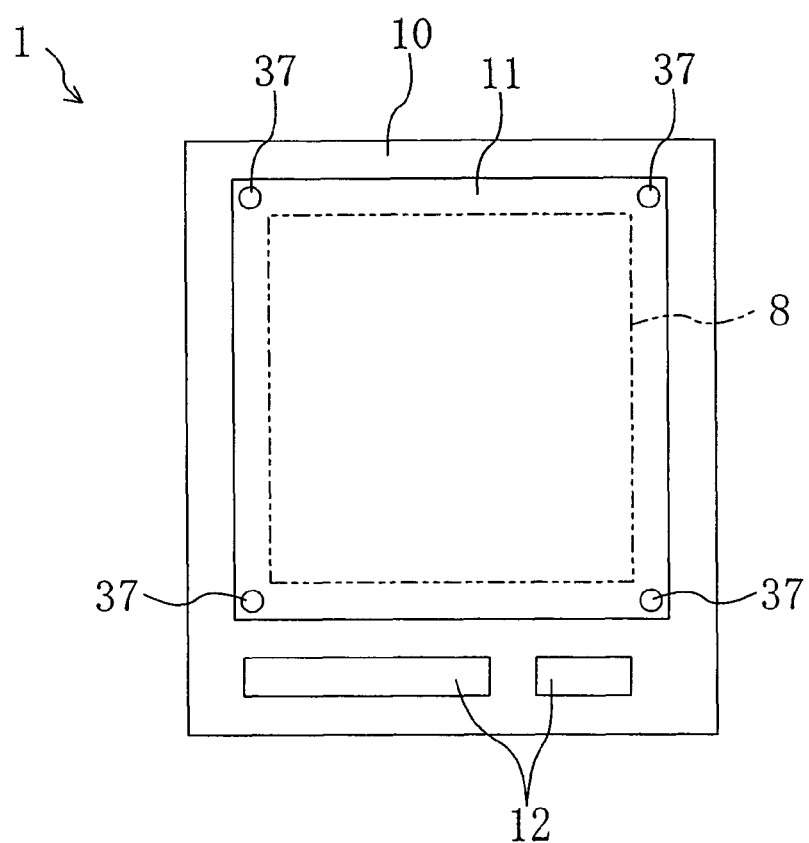
FIG. 14 is a plan view illustrating the appearance of a liquid crystal display device of the third preferred embodiment of the present invention.
Figure 15:
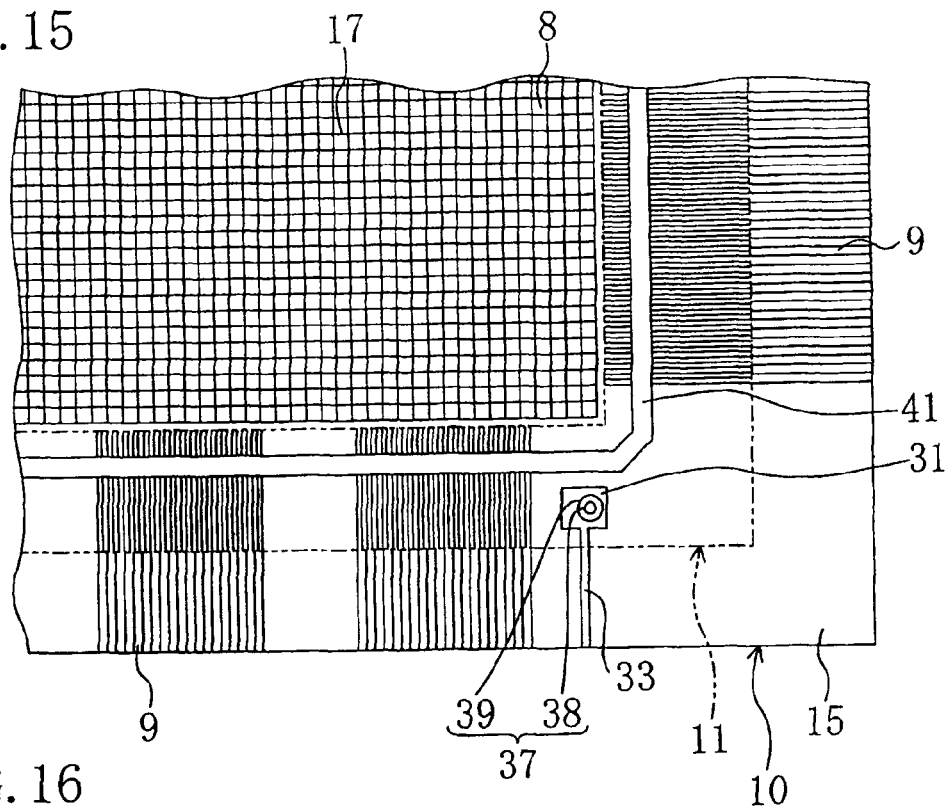
FIG. 15 is a plan view illustrating partial enlargement of a TFT substrate.

FIG. 13 to FIG. 15 show a third preferred embodiment of the present invention. FIG. 13 is a sectional view schematically illustrating a liquid crystal display device 1 of the present preferred embodiment, FIG. 14 is a plan view schematically illustrating the appearance of the liquid crystal display device 1 of the present preferred embodiment and FIG. 15 is a plan view illustrating partial enlargement of a TFT substrate 10. FIG. 13 is depicted in a simple way and does not exactly correspond to FIG. 15.

In the liquid crystal display device 1 of the present preferred embodiment, a TFT substrate 10 as a first circuit component and a counter substrate 11 as a second circuit component include plastic plates 15 and 35, respectively. The plastic plate 15 of the TFT substrate 10 is provided with a barrier film 16 stacked on the surface thereof facing the counter substrate 11. The plastic plate 35 of the counter substrate 11 is provided with a barrier film 36 on the surface thereof facing the TFT substrate 10. A liquid crystal layer 30 is provided between the TFT substrate 10 and the counter substrate 11 and sealed therein with a sealant 41.

On the barrier film 16 of the TFT substrate 10, a circuit section 17 including gate lines and source lines is formed in the display region 8 as shown in FIG. 13 to FIG. 15. On the TFT substrate 10, common electrode pads 31 as first electrodes are provided on the periphery of the display region 8. A line 33 is connected to each of the first common electrode pads 31 and drawn to the implementation region 9.

On the counter substrate 11, second common electrode pads 32 as second electrodes are arranged to face the first common electrode pads 31 as shown in FIG. 13. In the display region 8, a common electrode 34 made of ITO or the like is stacked on the barrier film 36. The second common electrode pads 32 are connected to the common electrode 34.

Common transfer electrodes 37 are interposed between the TFT substrate 10 and the counter substrate 11 outside the liquid crystal layer 30. The first and second common electrode pads 31 and 32 are electrically connected to each other via the common transfer electrodes 37 via pressure applied thereto in the directions approaching each other. In this state, an electrical signal supplied from the implementation region 9 of the TFT substrate 10 through the line 33 is supplied to the common electrode 34 on the counter substrate 11 via the first and common electrode pads 31 and 32 and the common transfer electrodes 37.

Portions of the barrier film 16 of the TFT substrate 10 in regions for forming the common electrode pads 31 are removed from the surface of the plastic plate 15. Further, portions of the barrier film 36 of the counter substrate 11 in regions for forming the second common electrode pads 32 are removed from the surface of the plastic plate 35. That is, the first and second common electrode pads 31 and 32 are directly formed on the surfaces of the plastic plate 15 and 35 from which the barrier films 16 and 36 are removed, respectively. In other words, the regions where the first and second common electrode pads 31 and 32 are provided are the removed regions 26 from which the barrier films 16 and 36 are removed.

For the production of the electrode connection structure of the present preferred embodiment, the first and second common pads 31 and 32 are formed after the process of removing the barrier films 16 and 36. After that, the TFT substrate 10 and the counter substrate 11 are bonded together with the common transfer electrodes 37 interposed therebetween.

In the conventional case where the barrier films 16 and 36 are not removed from the plastic plates 15 and 35, high stress is applied to portions of the barrier films 16 and 36 on which the common transfer electrodes 37 are provided. Therefore, the crack is likely to occur and propagate to the surrounding area. In the present preferred embodiment, the portions of the barrier films 16 and 36 in which the crack is likely to occur are removed. Therefore, the crack is prevented from propagating in the barrier films 16 and 36 to the adjacent circuit section 17 and the other first and second common electrodes 31 and 32. This allows prevention of reduction of display quality.

In the same manner as the first preferred embodiment, portions of the barrier films 16 and 36 overlapping with the common transfer electrodes 37 may be left and portions of the barrier films 16 and 36 surrounding the common transfer electrodes 37 may be removed From the surfaces of the plastic plates 15 and 35. With this configuration, even if the crack occurs in the portions of the barrier films 16 and 36 overlapping with the first and second common electrode pads 31 and 32, the crack is prevented from propagating outward beyond the removed regions 26. As a result, damage to the adjacent circuit section 17 and the other first and second common electrode pads 31 and 32 is restrained and the reduction of display quality is restrained.

Fourth Preferred Embodiment

Figure 17:
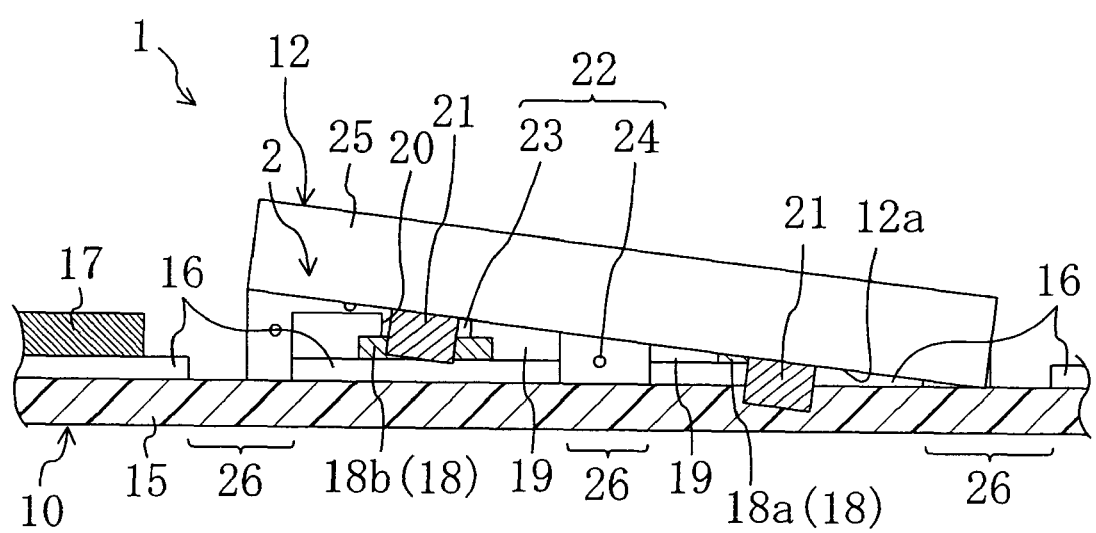
FIG. 17 is a sectional view illustrating enlargement of an electrode connection structure of a fourth preferred embodiment of the present invention.
Figure 18:
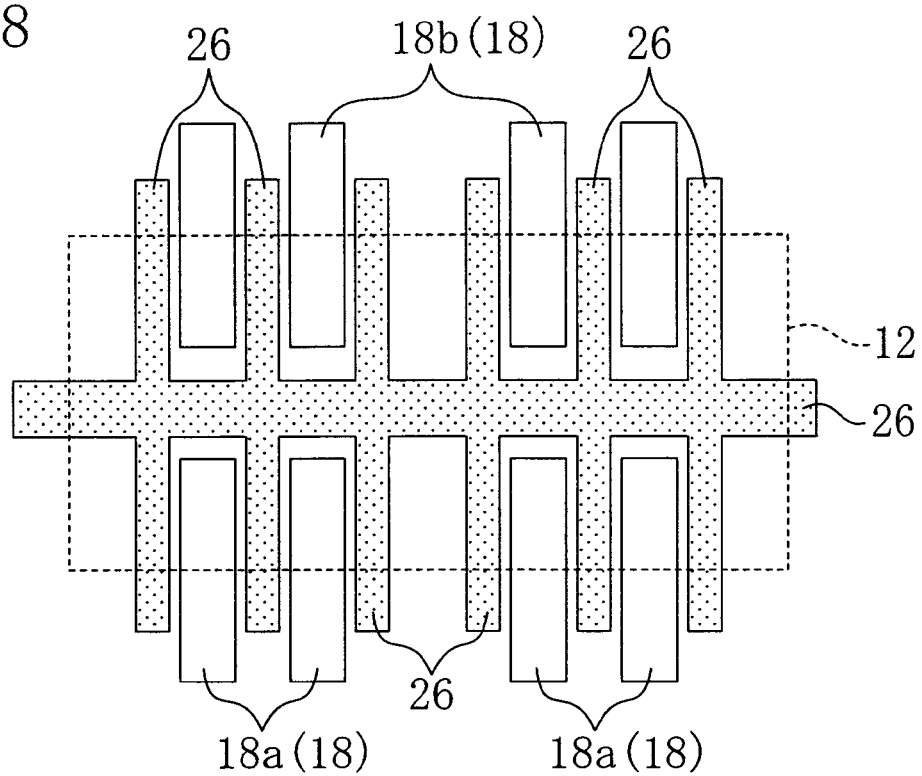
FIG. 18 is a plan view illustrating enlargement of terminals and the vicinity thereof.

FIG. 17 shows a fourth preferred embodiment of the present invention. FIG. 17 is a sectional view schematically illustrating a liquid crystal display device 1 of the present preferred embodiment.

The IC driver 12 is preferably implemented in such a manner that the plate-like body 25 is substantially parallel to the TFT substrate 10. In some cases, however, the body 25 is implemented on the TFT substrate 10 in a tilted state as shown in FIG. 17. If the degree of the tilt is high, a portion of the body 25 and the TFT substrate 10 are brought into contact via pressure applied thereto in the directions approaching each other.

In the present preferred embodiment, a portion of the barrier film 16 surrounding the portion of the TFT substrate in contact with the body 25 is at least partially removed from the surface of the plastic plate 15. Therefore, as shown in FIG. 17, the body 25 comes to contact with the portion of the plastic plate 15 from which the barrier film 16 is removed and the occurrence of the crack is prevented. Even if the body 25 comes to contact with a portion of the plastic plate 15 on which the barrier film 16 remains and the crack occurs, the crack is prevented from propagating beyond the region free from the barrier film 16. This makes it possible to restrain the damage to the terminals 18 and the circuit section 17 located in other region than the portion of contact between the body 25 and the TFT substrate 10.

Fifth Preferred Embodiment

Figure 19:
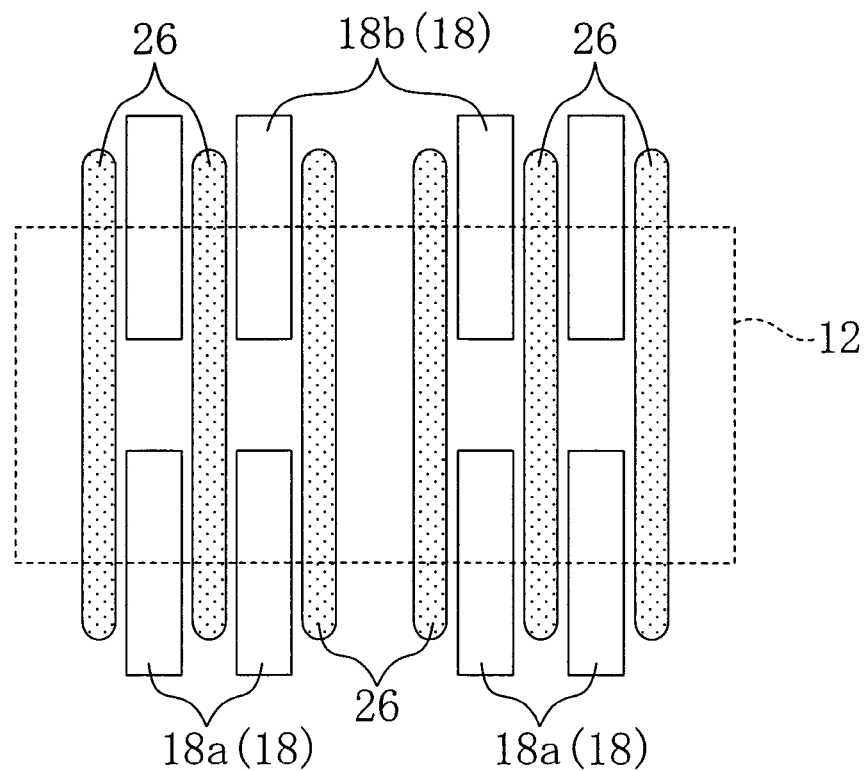
FIG. 19 is a plan view illustrating enlargement of terminals and the vicinity thereof.
Figure 20:
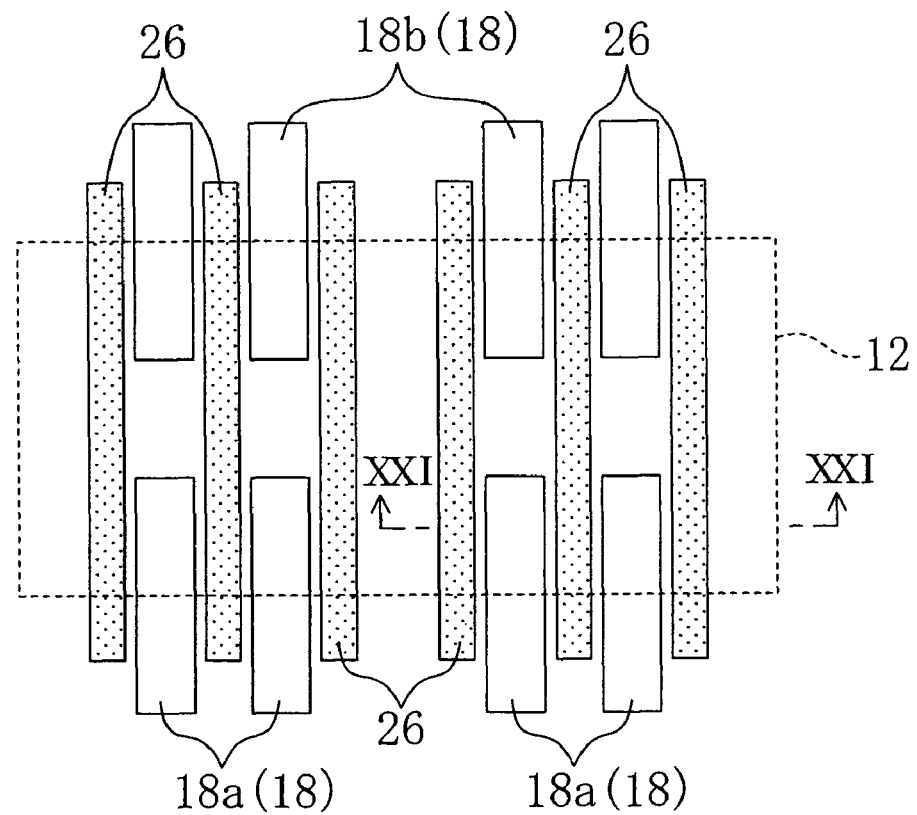
FIG. 20 is a plan view illustrating enlargement of terminals and the vicinity thereof.
Figure 21:
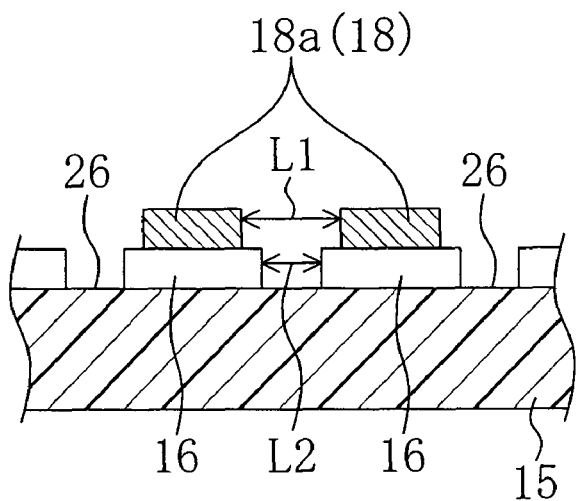
FIG. 21 is a sectional view taken along the line XXI-XXI shown in FIG. 20.
Figure 22:
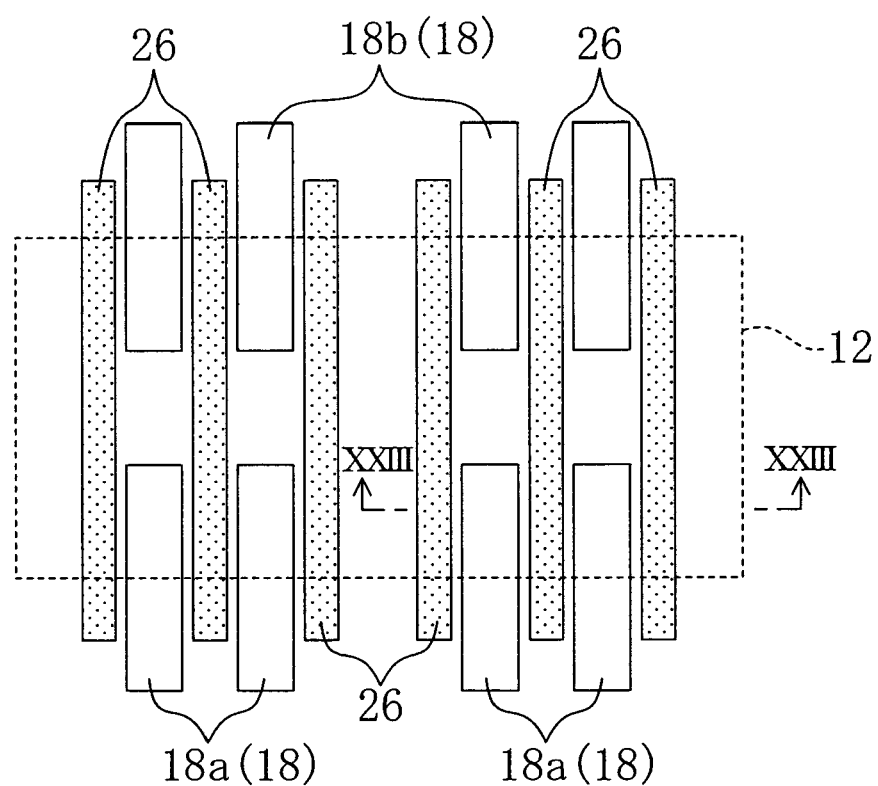
FIG. 22 is a plan view illustrating enlargement of terminals and the vicinity.
Figure 23:
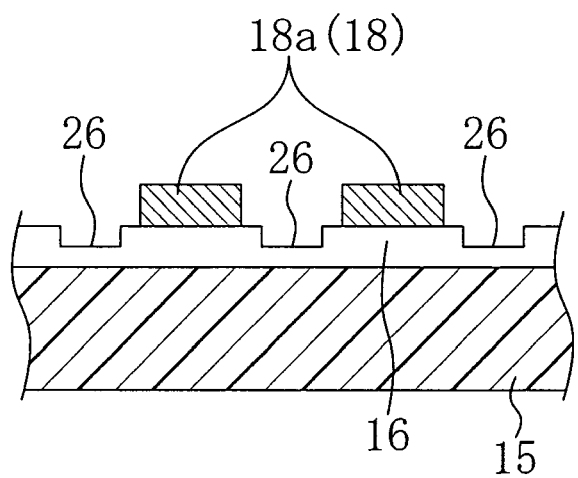
FIG. 23 is a plan view illustrating enlargement of terminals and the vicinity.
Figure 24:
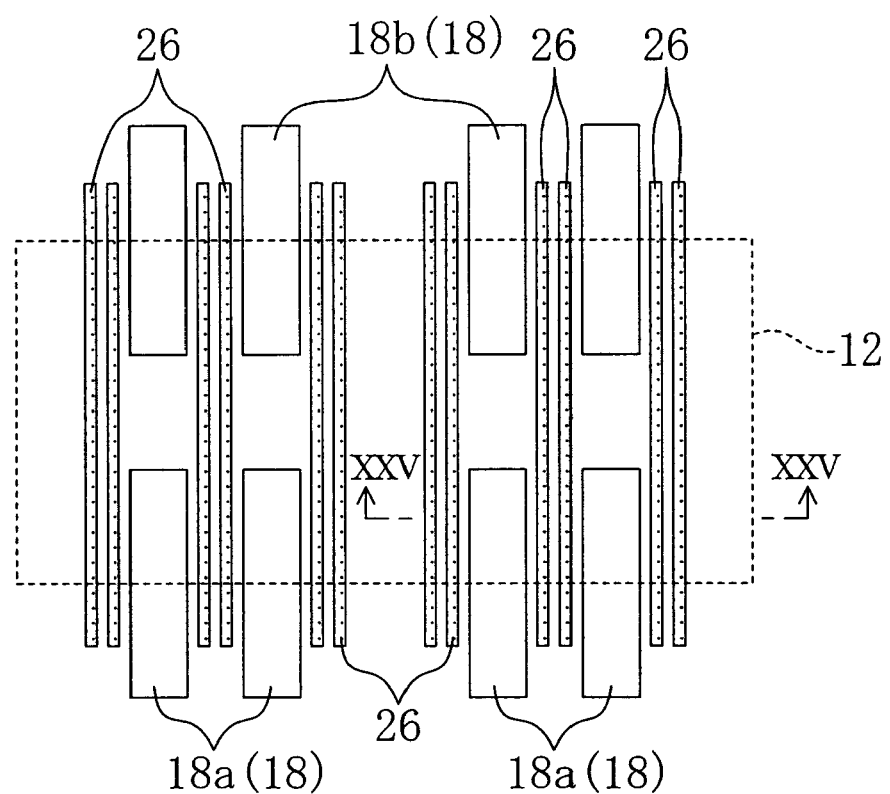
FIG. 24 is a plan view illustrating enlargement of terminals and the vicinity.
Figure 25:
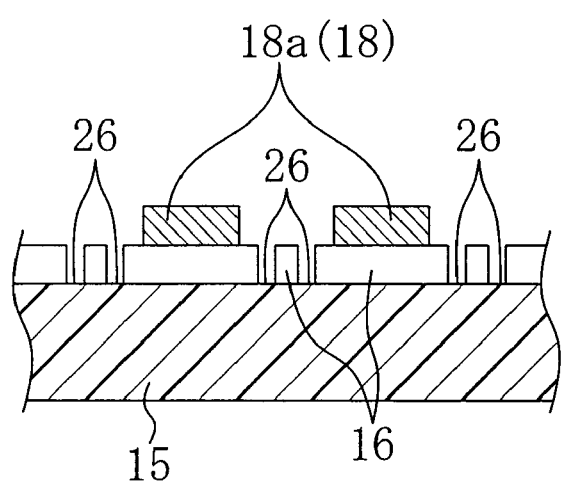
FIG. 25 is a sectional view taken along the line XXV-XXV shown in FIG. 24.

FIG. 18 to FIG. 26 show a fifth preferred embodiment of the present invention. FIG. 18 to FIG. 20, FIG. 22, FIG. 24 and FIG. 26 are plan views illustrating enlargement of the terminals 18 and the vicinity. FIG. 21 is a sectional view taken along the line XXI-XXI shown in FIG. 20, FIG. 23 is a sectional view taken along the line XXIII-XXIII shown in FIG. 22 and FIG. 25 is a sectional view taken along the line XXV-XXV shown in FIG. 24.

The fifth preferred embodiment is a modification of the first preferred embodiment in which the removed region 26 from which the barrier film 16 is removed is varied in shape as explained below.

In the first preferred embodiment described above, the barrier film 16 is partially removed such that the removed regions 26 are provided on the right and left sides of each of the terminals 18 and a portion of the barrier film 16 corresponding to the middle portion of the IC driver 12 is left. However, in another case shown in FIG. 18, the portion of the barrier film 16 corresponding to the middle portion of the IC driver 12 may also be removed such that the removed region 26 is arranged to extend longitudinal and lateral directions in FIG. 18. That is, a portion of the barrier film 16 between the input terminals 18*a* and the output terminals 18*b* is also removed to expose the surface of the plate 15 in the removed region 26. With the provision of the laterally extending removed region 26, the propagation of the crack between the input terminals 18*a* and the output terminals 18*b* is prevented.

In still another case, the removed region 26 may be configured such that at least a portion of the boundary line defining the removed region 26 is curved when viewed in the direction of the normal to the surface of the plate 15. To be more specific, as shown in FIG. 19, the removed regions 26 are arranged to extend in the longitudinal direction from the input side to the output side of the terminals 18 and the ends of each of the removed regions 26 may be convex-curved. With this configuration, the sharp edges of the removed regions 26 are eliminated and the crack is less likely to occur.

In still another case, the removed regions 26 may be formed to extend in the longitudinal direction from the input side to the output side of the terminals 18 as shown in FIG. 20. Further, as shown in FIG. 21, a predetermined relationship may be established between a clearance L1 between adjacent terminals 18 in the lateral direction and a width L2 of each of the removed regions 26 in the lateral direction. The width L2 of the removed regions 26 is preferably small in order not to reduce the barrier effect of the barrier film 16. In the actual photolithography process, the minimum width L2 of the removed regions 26 is preferably about several μm. On the other hand, the width L2 of the removed region 26 is preferably large from the aspect of prevention of the propagation of the crack. Therefore, the width L2 of the removed regions 26 is preferably limited to be not less than several μm and not more than the clearance L1 between the terminals 18. With this configuration, the barrier effect of the barrier film 16 is maintained and the propagation of the crack is prevented.

In still another case, the removed regions 26 may be formed to extend in the longitudinal direction from the input side to the output side of the terminals 18 as shown in FIG. 22 and portions of the barrier film 16 surrounding the input terminals 18*a* and the output terminals 18*b* may be at least partially thinned down as shown in FIG. 23. That is, in the removed regions 26, the barrier film 16 is not completely removed but left thin. In the removed regions 26, the surface of the plate 15 is covered with the barrier film 16 which is thinned down to about 200 Å to about 300 Å, for example. Therefore, the barrier effect of the barrier film 16 is maintained. Further, the resistance to the crack is improved and the propagation of the crack is reduced.

In still another case as shown in FIG. 24, the removed regions 26 formed to extend in the longitudinal direction from the input side to the output side of the terminals 18 may be configured in the form of slits. As shown in FIG. 24 and FIG. 25, each of the removed regions 26 may be configured of two slits formed in the barrier film 16. The surface of the plate 15 is exposed in the removal regions 26. With this configuration, the surface area of the barrier film 16 is not reduced very much and the barrier effect of the barrier film 16 is kept high even if the barrier film 16 is removed. Additionally, as the barrier film 16 is removed, the propagation of the crack is prevented. Two or more slits may be formed. With the provision of a plurality of slits, the occurrence of propagation of the crack is reduced to a further extent.

Figure 26:
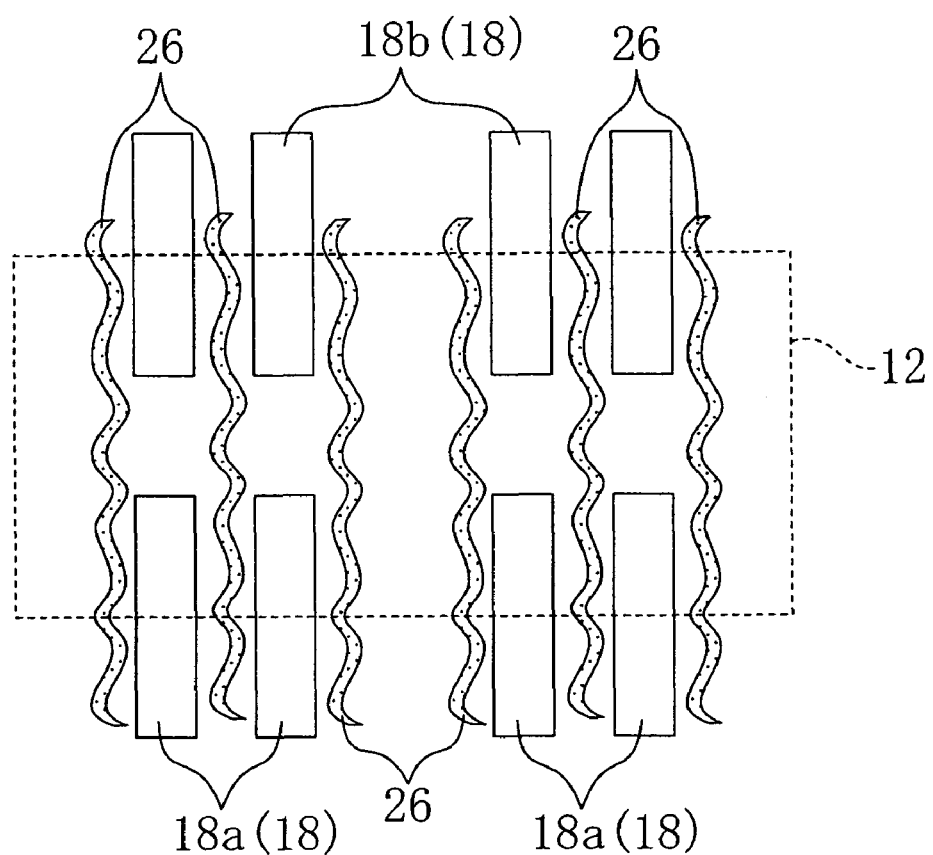
FIG. 26 is a plan view illustrating enlargement of terminals and the vicinity.
Figure 27:
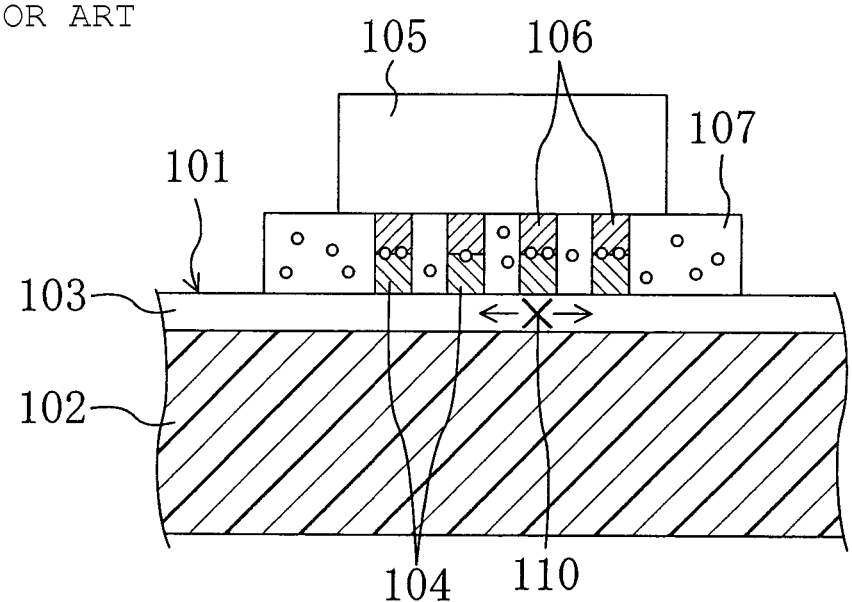
FIG. 27 is a sectional view illustrating enlargement of a conventional electrode connection structure.
Figure 28:
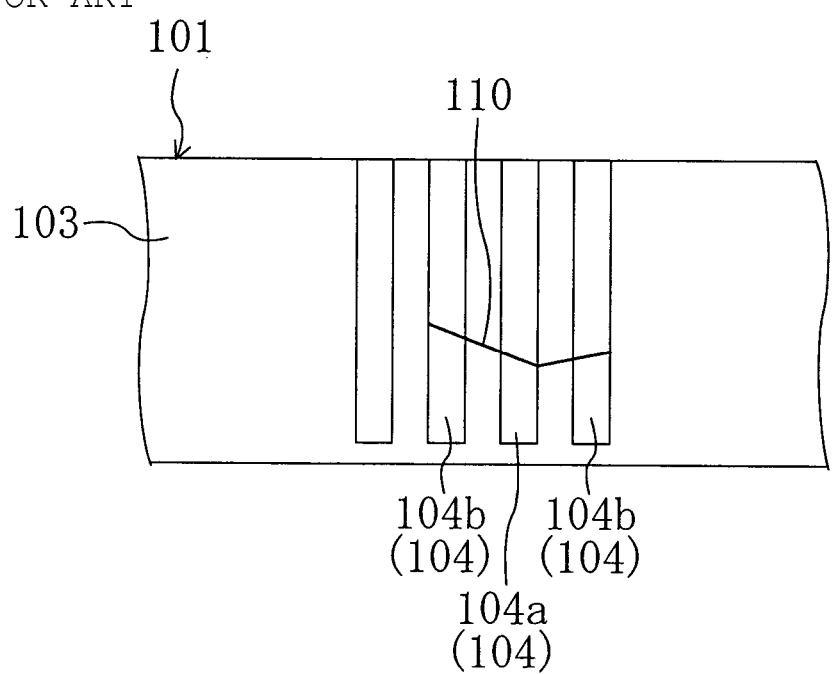
FIG. 28 is a plan view illustrating a crack growing toward adjacent terminals according to conventional art.

In still another case as shown in FIG. 26, the removed regions 26 formed to extend in the longitudinal direction from the input side to the output side of the terminals 18 between the adjacent terminals 18 may be arranged to have a serpentine shaped configuration snaking in the longitudinal direction in FIG. 26, respectively. With this configuration, the surface area of the barrier film 16 is not reduced very much. Therefore, the barrier effect of the barrier film is maintained and the propagation of the crack is prevented.

Other Preferred Embodiments

Figure 16:
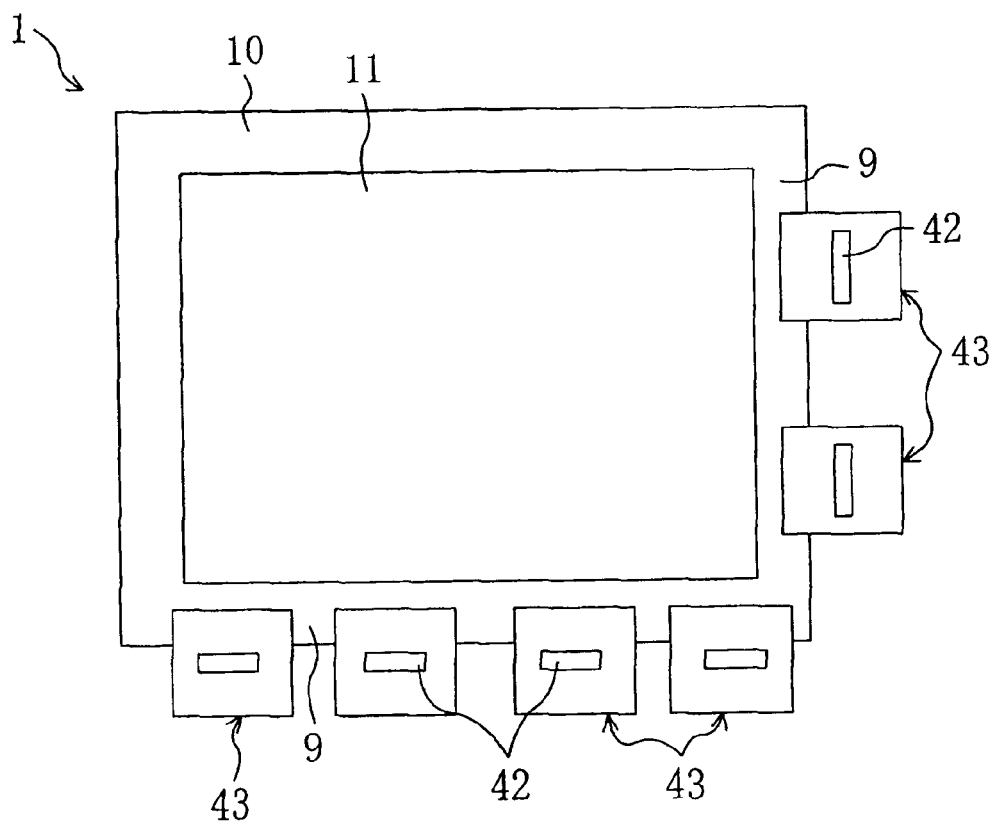
FIG. 16 is a plan view illustrating the appearance of a liquid crystal display device of another preferred embodiment of the present invention.

The above-described preferred embodiments are directed to a configuration in which the IC driver 12 or the counter substrate 11 is connected to the TFT substrate 10 (i.e., the second circuit component is the IC driver 12 or the counter substrate 11). However, the present invention is not limited thereto. For example, as shown in FIG. 16, the present invention may be applied to an electrode connection structure in which the connection is achieved by TCP (tape carrier package) with use of TAB or COF. To be more specific, as shown in FIG. 16, a plurality of TCPs each carrying an IC driver 42 may be connected to the implementation region 9 of the TFT substrate 10. The second electrodes are provided on the TCPs and connected to the first electrodes (terminals) of the TFT substrate 10. The present invention may also be applied to the electrode connection structure for connecting the FPC 13 shown in FIG. 1.

According to the first and second preferred embodiments, the terminals 18 and the bumps 21 are connected via the ACF 22. However, the present invention is not limited thereto. The present invention may also be applied to a structure in which the ACF 22 is omitted (i.e., the electrodes are directly press bonded) or a structure in which the ACF 22 is replaced with conductive paste, an NCF (non conductive film) or an adhesive resin.

In the above-described preferred embodiments, the liquid crystal display device is taken as an example of the display device. However, the present invention is not limited thereto.

For example, the present invention may also be applied to other displays such as organic EL displays and field emission displays (FED).

In the above-described preferred embodiments, the plastic plate is preferably used as the plate 15. However, the present invention is not limited thereto and a metal plate may be used as the plate 15. If the metal plate is thin, it gives flexibility and the crack may possibly occur in a barrier film provided on the surface of the metal plate. When the metal plate is used as the plate 15, the circuit production process can be carried out at high temperature and a high performance circuit is produced. However, in general, there are many projections and depressions on the surface of the metal plate and therefore the metal plate has to be planarized (formation of the barrier film) before the production of the circuit. As the metal plate, a stainless steel plate or an invar plate may be used, for example, and the surface of the plate is preferably mirror-finished in advance. As a barrier film for planarizing the metal plate surface, a thin inorganic film, a thin organic film or a thin stack of them may be applied to the metal plate surface by spin coating, bar coating or spray coating. After the formation of the barrier film, the process proceeds in the same manner described in the first preferred embodiment.

Thus, as described above, preferred embodiments of the present invention are useful for an electrode connection structure for connecting electrodes of two or more circuit components and a display device including the electrode connection structure. In particular, preferred embodiments of the present invention effectively restrain and prevent the propagation of a crack formed in a barrier film stacked on a resin plate for forming a circuit substrate, restrain and prevent damage to circuits and electrodes and improve the adhesion between the circuit components.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An electrode connection structure comprising:
    a first circuit component including a flexible plate, a barrier film stacked on a surface of the flexible plate, a circuit section located on the barrier film and a first electrode provided on the surface of the flexible plate on which the barrier film is stacked; and
    a second circuit component arranged to face the first circuit component and including a second electrode facing the first electrode; wherein
    the first electrode of the first circuit component and the second electrode of the second circuit component are connected via pressure applied thereto in the directions approaching each other: the first electrode is provided directly on a surface of the barrier film; and
    a portion of the barrier film surrounding the first electrode is at least partially removed from the surface of the flexible plate; a removed region from which the barrier film is removed is configured such that at least a portion of a boundary line thereof that defines the removed region is curved when viewed in the direction of the normal to the surface of the flexible plate.

2. The electrode connection structure of claim 1, wherein the second circuit component includes a body having a circuit connected to the second electrode, a portion of the body and the first circuit component are in contact with each other via pressure applied thereto in the directions approaching each other, and a portion of the barrier film surrounding portion of the first circuit component in contact with the body is at least partially removed from the surface of the flexible plate.

3. The electrode connection structure of claim 1, wherein the first electrode is provided on the flexible plate with the barrier film interposed therebetween.

4. The electrode connection structure of claim 1, wherein the first electrode is directly provided on the surface of the flexible plate.

5. The electrode connection structure of claim 1, wherein an anisotropic conductive film containing conductive particles is interposed between the first and second electrodes.

6. The electrode connection structure of claim 1, wherein a plurality of first electrodes are adjacent to each other.

7. The electrode connection structure of claim 1, wherein a common transfer electrode is interposed between the first and second electrodes.

8. The electrode connection structure of claim 1, wherein the first electrode includes a plurality of input terminals arranged to input a signal to the second circuit component and a plurality of output terminals arranged at a certain interval from the input terminals to output a signal from the second circuit component, and a portion of the barrier film between the input terminals and the output terminals has also been removed.

9. The electrode connection structure of claim 1, wherein a plurality of first electrodes are provided at certain intervals and removal regions from which the barrier film is removed are located between adjacent first electrodes, and each of the removed regions has a width not larger than a clearance between adjacent first electrodes.

10. The electrode connection structure of claim 1, wherein a plurality of first electrodes are arranged at certain intervals and removed regions from which the barrier film is removed are located between adjacent first electrodes and each of the removed regions includes a plurality of slits.

11. The electrode connection structure of claim 1, wherein a plurality of first electrodes are arranged at certain intervals and removed regions from which the barrier film is removed are located between adjacent first electrodes, and each of the removed regions is arranged in a serpentine shaped configuration snaking between adjacent first electrodes.

* * * * *